INVENTOR.
GEORGE J. GILBERT
BY
[signature]
Attorney

June 13, 1967 G. J. GILBERT 3,325,707

TRANSISTOR WITH LOW COLLECTOR CAPACITANCE
AND METHOD OF MAKING SAME

Filed April 26, 1965 2 Sheets-Sheet 2

INVENTOR.
GEORGE J. GILBERT
BY
Attorney 3,325,707

TRANSISTOR WITH LOW COLLECTOR CAPACITANCE AND METHOD OF MAKING SAME

George J. Gilbert, Whitehouse Station, N.J., assignor to Radio Corporation of America, a corporation of Delaware Filed Apr. 26, 1965, Ser. No. 450,970
3 Claims. (Cl. 317—235)

ABSTRACT OF THE DISCLOSURE

A low collector-capacitance transistor comprises a collector layer, a base layer on the collector layer, and an emitter layer on the base layer. The collector layer has a region of reduced resistivity coextensive with the emitter layer and adjacent to the base layer, forming a part of the PN junction between the collector layer and the base layer. The base layer has a charge carrier concentration that is greater than that of the zone of reduced resistivity in the collector layer but less than that of the emitter layer.

Figure 1:
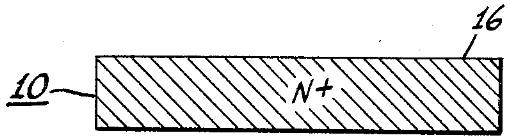

This invenion relates generally to semiconductor devices, and more particularly to an improved transistor and a novel method of making it. The improved transistor has a relatively low collector capacitance and is particularly useful for relatively high frequency and/or fast switching circuit applications.

The frequency response and switching speed of which a transistor is capable are functions of the collector capacitance of the transistor. By the term "collector capacitance," as used herein, is meant the capacitance between the collector and the base and between the collector and the emitter. These capacitance effects are produced by the PN junctions within the transistor. Generally, the emitter-collector current of a transistor flows through a resistive load in an external circuit. Thus, the resistive load together with the collector capacitance, forms a resistance-capacitance network, and the frequency response and the switching speed of the transistor therefore vary inversely with the value of the collector capacitance. If, the resistivity of the collector layer is increased to decrease the collector capacitance, the current handling capacity of the transistor is also reduced. On the other hand, if the resistivity of the collector layer is decreased, the collector-base breakdown voltage of the transistor is correspondingly decreased.

It is an object of the present invention to provide a novel method of making an improved transistor.

Another object of the present invention is to provide an improved transistor capable of operating at higher frequencies and switching speeds than transistors of the prior art.

Still another object of the present invention is to provide an improved transistor capable of higher current-carrying capacity and gain than transistors of the prior art.

A further object of the present invention is to provide an improved transistor of the type described that is relatively simple in construction, efficient in use, and lends itself to manufacture by a novel method that is relatively easy and inexpensive to carry out.

Briefly, the improved transistor comprises a body of semiconductor material, having collector, base, and emitter regions, wherein the collector region comprises a zone of reduced resistivity adjacent to the base region, and directly opposite to the emitter region.

The improved, low collector capacitance transistor may be manufactured by the novel method which, in a preferred embodiment, comprises the improvement of (1) depositing a dopant between two collector layers of the transistor, and (2) heating the collector layers until the dopant diffuses to a site on a major surface of one of the collector layers. The site is opposite, and as close as possible to, the portion of the transistor through which the emitter will eventually be diffused.

Figure 7:
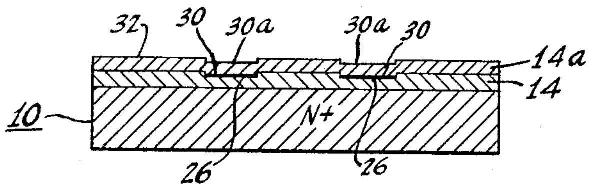
Figure 8:
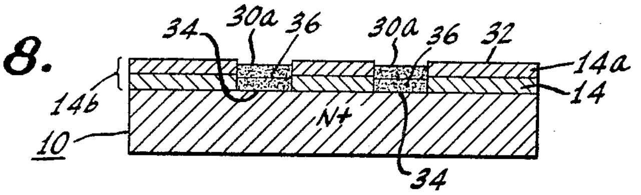
Figure 9:
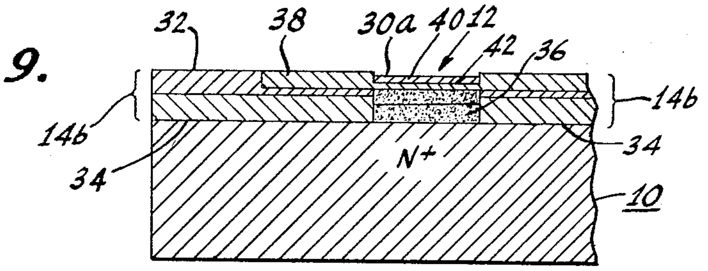

The novel features of the present invention, as well as the invention itself, both as to its organization and method of operation, will be understood more fully when considered in connection with the accompanying drawing, in which similar reference characters represent similar parts throughout, and in which:

FIGS. 1 to 8 represent cross-sections of a body of semiconductor material in different stages of making of the improved transistor; and FIG. 9 is an enlarged, fragmentary, cross-sectional view of the improved transistor.

While the present method will be described for the manufacture of improved NPN transistors, improved PNP transistors may also be manufactured by the instant method by substituting P type material for the N type material, and N type material for the P type material described herein.

Referring now particularly to FIG. 1 of the drawing, there is shown a substrate wafer 10 of semiconductor material, such as silicon or germanium. The wafer 10 is heavily doped N+ type semiconductor material and may have a resistivity of between 0.001 ohm-cm. and 0.02 ohm-cm. The wafer 10 may be rectangular or circular in shape, and, if circular, may have a diameter of about 1 inch and a thickness of between 5 and 9 mils. The wafer 10 is a rigid substrate upon which the novel transistors, such as transistor 12 (FIG. 9), will be disposed and which may function also as a collector contact for these transistors, as will hereinafter be described.

Figure 2:
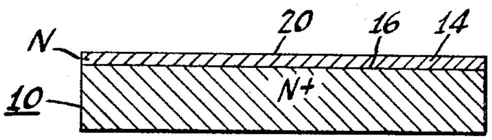

The first step in making the transistor 12, starting with the wafer 10, is to provide a collector layer 14 on a major surface 16 of the wafer 10. The layer 14 may comprise N type semiconductor material of a resistivity between 10 ohm-cm. and 100 ohm-cm., and may be deposited on the surface 16 of the wafer 10 to a thickness of between 0.2 mil and 0.6 mil, as shown in FIG. 2. The layer 14 may be deposited as an epitaxial layer, for example, by any suitable deposition technique known in the art.

Figure 3:
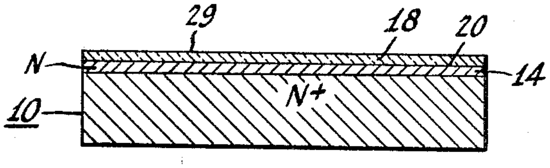

A masking layer, such as an oxide layer 18, is provided on the upper major surface 20 of the layer 14, as shown in FIG. 3. If the layer 14 comprises N type silicon, the oxide layer 18 may be formed by oxidizing the upper major surface 20 of the layer 14 to silicon dioxide. This may be accomplished by heating the layer 14 in steam at a temperature of about 1200° C. for about 2 hours, or until the oxide layer 20 is between 5,000 A. and 10,000 A. thick.

Figure 4:
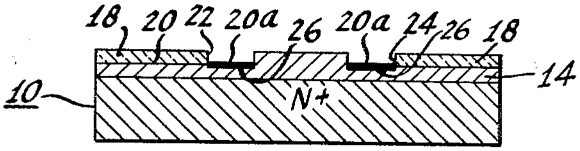

A plurality of novel transistors 12 may be manufactured simultaneously, steps in the manufacture of two such transistors being shown in FIGS. 4 to 8. Openings 22 and 24, are etched through the oxide layer 18, as shown in FIG. 4, for each transistor 12 to be manufactured. The location of the openings 22 and 24 may be determined by suitable photolithographic masking and etching techniques well known in the art. The openings 22 and 24 expose portions 20a of the major surface 20 of the layer 14.

An N type dopant 26, such as antimony, for example, is now deposited on the surface portions 20a of the layer 14 that are exposed by the openings 22 and 24. The dopant 26 may be deposited by any suitable means known in the art, such as by the deposition of vaporized antimony in a two-zone furnace, and the quantity so deposited should provide a surface carrier concentration of between $10^{17}/cm.^3$ and $10^{20}/cm.^3$.

Figure 5:
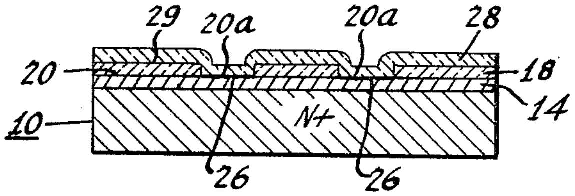
Figure 6:
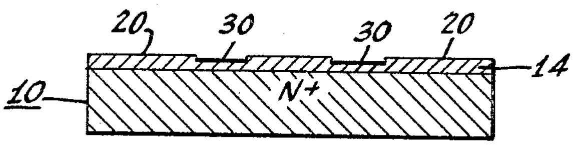

Another oxide layer 28 is now deposited on the upper major surface 29 of the oxide layer 18 and over the portions 20a of the major surface 20 exposed by the openings 22 and 24, as shown in FIG. 5. The oxide layer 28 may be grown to a thickness of between 5,000 A. and 10,000 A., as for example, by the aforementioned oxidation operation. During this oxidation operation, the exposed surface portions 20a of the layer 14 are oxidized at a faster rate than that of the unexposed surface 20, resulting in depressions 30 in the upper surface 20 of the layer 14 when the oxide coatings 18 and 28 are later removed, as shown in FIG. 6.

The oxide coatings 18 and 28 are now removed, as with any suitable known etching solution, exposing the upper major surface 20 of the layer 14 and the depressions 30 therein. The depressions 30 function to subsequently locate the sites through which an emitter dopant will eventually be diffused, as will hereinafter be explained.

Another N type collector layer 14a, similar to the layer 14, is deposited on the major surface 20 of the layer 14, including the depressions 30, as shown in FIG. 7. The layer 14a may be deposited by epitaxial techniques known in the art, and may have a resistivity between 10 ohm-cm. and 100 ohm-cm. The layers 14 and 14a should have substantially the same thickness so that the upper major surface 32 of the layer 14a will have depressions 30a directly over the depressions 30 in the layer 14. Subsequently, the depressions 30a will serve to locate sites through which an emitter dopant will be diffused for the manufacture of the transistor 12 (FIG. 9).

The dopant 26, previously deposited on the sites of the depressions 30 in the layer 14, is now diffused to provide discrete zones or regions 36 of relatively decreased resistivity in the collector layers 14 and 14a. This can be accomplished by heating the collector layers 14 and 14a at a temperature of about 1250° C. for a period of between 10 and 60 hours, until the concentration of carriers at the surface of the depressions 30a is between $10^{15}/cm.^3$ and $10^{16}/cm.^3$. During this heating operation, the dopant 26 diffuses upwardly to the depressions 30a in the upper surface 32 of the collector layer 14a, and downwardly to the lower major surface 34 of the collector layer 14, forming the regions 36 whose resistivity may be between 0.1 ohm-cm. and 10 ohm-cm. The particular resistivity of the regions 36 of any transistor 12 to be made by the instant method will depend upon the desired current-carrying capacity and the breakdown voltage characteristics of the transistor 12. The collector layers 14 and 14a may now be considered, for all practical purposes, as a single collector layer 14b, with a plurality of spaced-apart regions 36 of decreased resistivity, the regions 36 preferably extending between the upper and lower major surfaces 32 and 34 of the collector layer 14b, as shown in FIG. 8.

Using the semiconductor structure shown in FIG. 8, the transistors 12 can be made by diffusing a P type impurity through the surface 32 of the collector layer 14b to form a P type base layer 38, and diffusing an N type impurity partially into the base layer 38 at the site of each depression 30a to form an emitter layer 40 and a PN junction 42 with the base layer 38, as shown in FIG. 9. The depositions of the base layer 38 and the emitter layer 40 may be accomplished by any suitable means, as for example, by diffusion methods well known in the art.

The transistor 12, in FIG. 9, is an NPN transistor wherein the collector layer 14b has a region 36 of a lower resistivity than that of the bulk of the material of the collector layer 14b. The region 36 is preferably under the emitter layer 40 only, and extends between the upper and lower major surfaces 32 and 34 of the collector layer 14b. Suitable emitter and base leads (not shown) can be connected to the emitter and base layers 40 and 38, respectively, as by photolithographic and metal evaporation techniques, for example, known in the art. The substrate wafer 10 may function as the collector contact of the transistor 12.

The improved transistor provides a relatively lower collector capacitance than exhibited by transistors of the prior art, and, thus, is capable of an improved frequency response. The reduced collector capacitance also obviates the need for neutralization of the transistor in certain amplifier circuits. While only one, improved, low-collector-capacitance transistor and a novel method of making it have been described, variations in the components of the transistor, as well as in the method of making it, all coming within the spirit of this invention, will, no doubt, readily suggest themselves to those skilled in the art. Hence, it is desired that the foregoing shall be considered as illustrative and not in a limiting sense.

What is claimed is:

1. A transistor of semiconductor material comprising:
a first layer of one conductivity type,
a second layer of an opposite conductivity type to said one conductivity type on said first layer and forming a first PN junction therewith,
a third layer of the same conductivity type as said first layer on said second layer and forming a second PN junction with said second layer, said third layer having a lesser lateral extent than said first and second layers, and
a zone of reduced resistivity, with respect to the resistivity of said first layer, in said first layer opposite to said third layer and substantially coextensive with said third layer, said zone extending throughout the thickness of said first layer, whereby to form a portion of said first PN junction with said second layer, and said second layer having a charge carrier concentration that is greater than that of said zone and less than that of said third layer.

2. A transistor comprising:
a first layer of silicon of one conductivity type having a pair of opposite major surfaces,
a second layer of silicon of an opposite conductivity type to said one conductivity type on said first layer and forming a PN junction therewith, and
a third layer of silicon of the same conductivity type as said first layer on said second layer,
said first layer including a zone of decreased resistivity, with respect to the resistivity of said first layer, extending between said opposite major surfaces and forming only a portion of said first layer, said portion being opposite to, and substantially coextensive with, said third layer, whereby to form a part of said PN junction with said second layer, said zone having a resistivity of between 0.1 ohm-cm. and 10 ohm-cm., and said second layer having a charge carrier concentration that is greater than that of said zone of decreased resistivity and less than that of said third layer.

3. A transistor comprising:
a substrate of semiconductor material having a resistivity of between 0.001 ohm-cm. and 0.02 ohm-cm.,
a first layer of semiconductor material of one conductivity type on said substrate, said first layer having a pair of opposite major surfaces and a resistivity of between 10 ohm-cm. and 100 ohm-cm.,
a second layer of semiconductor material of an opposite conductivity type of said one conductivity type on said first layer and forming a PN junction with said first layer, and
a third layer of semiconductor material of the same conductivity type as said first layer on said second layer,
said first layer including a zone of decreased resistivity, with respect to the resistivity of said first layer, extending between said opposite major surfaces of said first layer and being substantially coextensive with said third layer, whereby to form a portion of said PN junction with said second layer, said zone having a resistivity of between 0.1 ohm-cm. and 10 ohm-cm., and said second layer having a charge carrier concentration that is greater than that of said zone of decreased resistivity and less than that of said third layer.

References Cited

UNITED STATES PATENTS

| | | | |
|---|---|---|---|
| 3,123,750 | 3/1964 | Hutson et al. | 317—235 |
| 3,150,299 | 9/1964 | Noyce | 317—235 |
| 3,183,128 | 5/1965 | Leistiko | 148—186 |
| 3,205,373 | 9/1965 | Hyman | 307—88.5 |
| 3,226,614 | 12/1965 | Haenichen | 317—234 |
| 3,244,950 | 4/1966 | Ferguson | 317—235 |
| 3,253,197 | 5/1966 | Haas | 317—235 |

FOREIGN PATENTS

| | | |
|---|---|---|
| 76,389 | 7/1961 | France. |

JOHN W. HUCKERT, *Primary Examiner.*

M. EDLOW, *Assistant Examiner.*